United States Patent
Ikeda et al.

(10) Patent No.: US 6,950,640 B2
(45) Date of Patent: Sep. 27, 2005

(54) FM DETECTOR CIRCUIT

(75) Inventors: Yoshihiro Ikeda, Himi (JP); Kunio Sawai, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 429 days.

(21) Appl. No.: 10/356,474

(22) Filed: Feb. 3, 2003

(65) Prior Publication Data

US 2003/0164729 A1 Sep. 4, 2003

(30) Foreign Application Priority Data

Feb. 5, 2002 (JP) ........................................ 2002-027740

(51) Int. Cl.⁷ ................................................ H04B 1/16
(52) U.S. Cl. ...................... 455/214; 329/328; 329/336
(58) Field of Search ................................ 455/130, 142, 455/205, 214, 216; 329/315, 323, 325, 327, 328, 336, 337

(56) References Cited

U.S. PATENT DOCUMENTS

| | | | | |
|---|---|---|---|---|
| 4,562,404 A | * | 12/1985 | Futakuchi | .................... 329/328 |
| 5,053,717 A | * | 10/1991 | Schulz et al. | ................ 329/300 |
| 5,109,542 A | * | 4/1992 | Ecklund | ...................... 455/214 |
| 5,619,531 A | * | 4/1997 | Taylor et al. | ................ 375/222 |
| 5,929,716 A | * | 7/1999 | Komori et al. | ............. 455/263 |

FOREIGN PATENT DOCUMENTS

JP  5-283968  10/1993

* cited by examiner

Primary Examiner—Quochien B. Vuong
(74) Attorney, Agent, or Firm—Keating & Bennett, LLP

(57) ABSTRACT

An FM detector circuit includes a bridge circuit having four sections with a discriminator connected as one of the four sections. An FM intermediate frequency is applied across one pair of diagonally opposed nodes of the bridge circuit and an output is picked up across the other pair of diagonally opposed nodes of the bridge circuit. The discriminator includes a piezoelectric material that is selected to produce stable overall temperature characteristics.

20 Claims, 7 Drawing Sheets

FIG. 1A
PRIOR ART
FIG. 1B
PRIOR ART
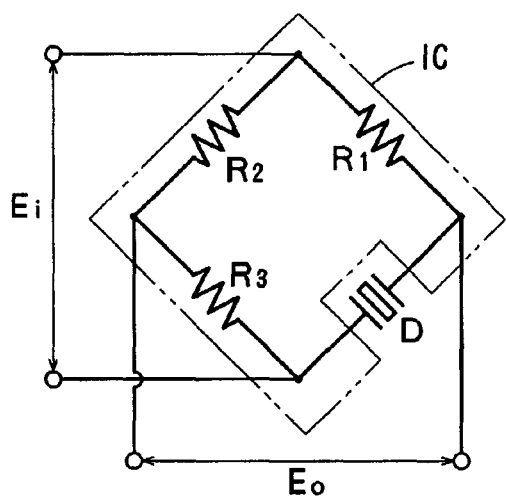
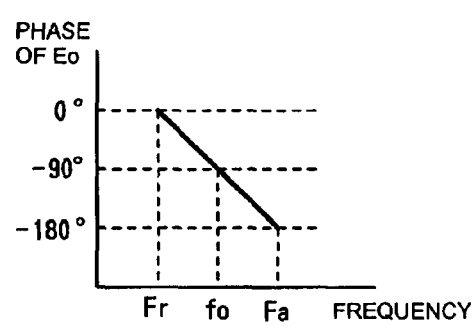

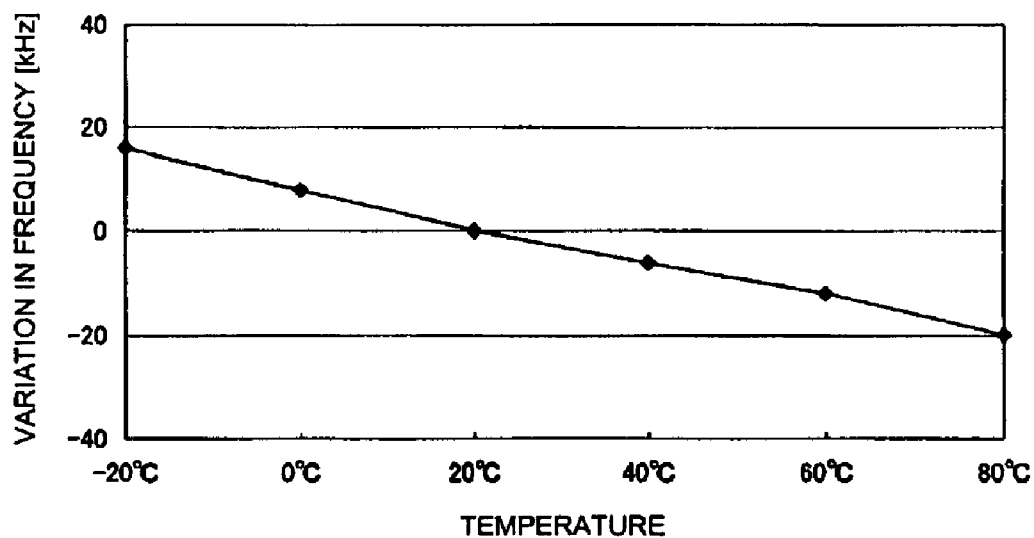
FIG. 6A  $f_{OTC} = -33.8 ppm/°C$
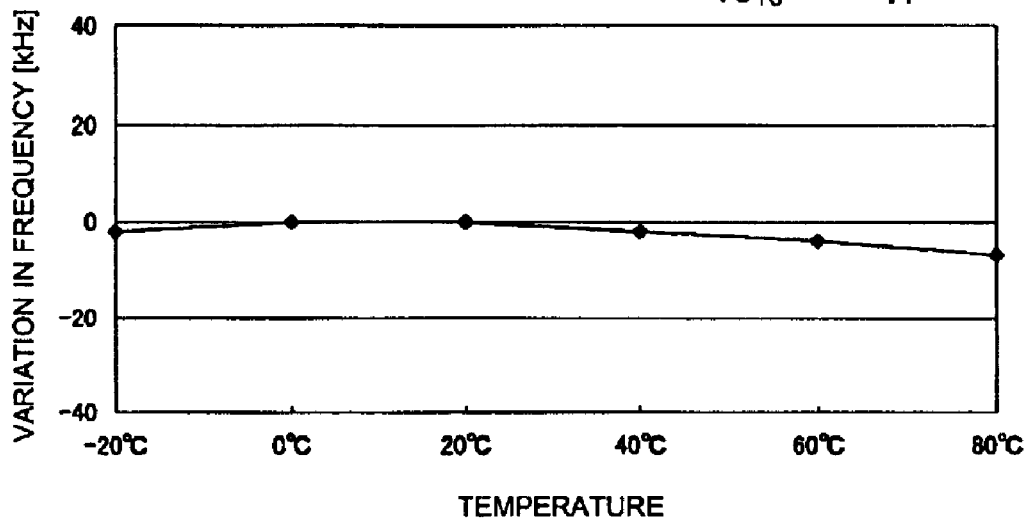
FIG. 6B  $f_{OTC} = -6.5 ppm/°C$ FIG.7A
FIG.7B
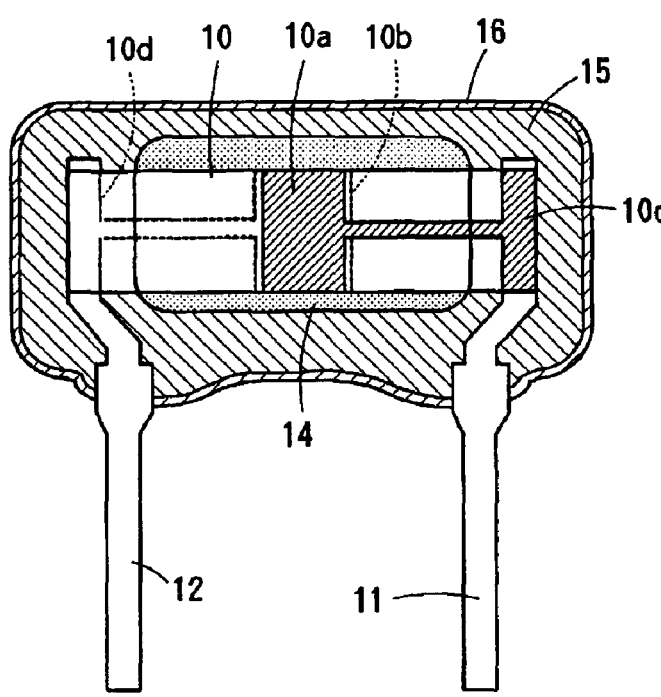
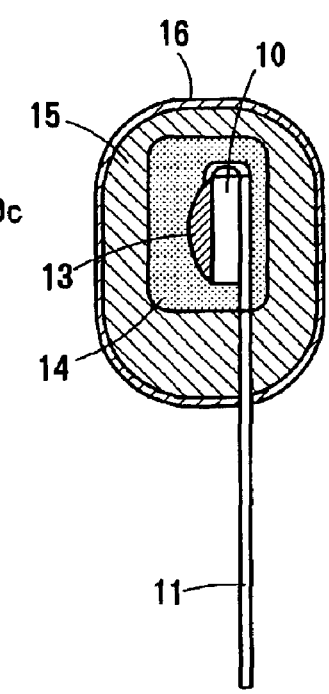

FM DETECTOR CIRCUIT

BACKGROUND OF THE INVENTION

1. Field of the Invention

The present invention relates to an FM detector circuit using a discriminator.

2. Description of the Related Art

Known FM detector circuits use a discriminator as a phase shifter for detecting a deviation in frequency of an FM signal as a variation in voltage. A piezoelectric material of the discriminator typically has a low Q and a wide band Δf (=Fa (antiresonance frequency)–Fr (resonance frequency)) that results in a wide demodulated output bandwidth. Various types of temperature characteristics of each piezoelectric material are not appropriate, and the temperature characteristic (fo$_{TC}$) of the discriminator is relatively large. The range of temperature within which an FM apparatus remains operable is narrower than that of a ceramic filter for FM application. The FM apparatuses are thus subject to a very narrow operation temperature range limit.

Conventionally, the temperature characteristic (fo$_{TC}$) of the discriminator is about 25 ppm/° C. or so. A discriminator having an fo of 10.7 MHz is subject to a frequency variation of about 28 kHz within a temperature range of about 100° C., and a frequency variation of about 40 kHz within a temperature range of about 150° C. Conventional discriminators tend to suffer from more frequency variation in a high temperature range above 20° C. To satisfy the typically applied standard of fo$_{TC}$, namely, variations of about ±30 kHz of the center frequency fo, the upper operating temperature is limited to about 60° C.

The inventors of the present invention have proposed a method that stabilizes frequency-temperature characteristics of a discriminator (a piezoelectric resonator), as described in Japanese Patent Application No. 2001-89064 which is not published yet.

The disclosed method is based on the finding that a difference between a temperature characteristic fo$_{TC}$ of the center frequency of the discriminator and a mean value of a temperature characteristic Fr$_{TC}$ of a resonance frequency and a temperature characteristic Fa$_{TC}$ of an antiresonance frequency is proportional to a product of a temperature characteristic ε$_{TC}$ of a capacitance of the discriminator and a specific frequency bandwidth Δf/fo of the discriminator. The temperature characteristic fo$_{TC}$ of the center frequency is approximated from the temperature characteristic Fr$_{TC}$ of the resonance frequency, the temperature characteristic Fa$_{TC}$ of the antiresonance frequency, the temperature characteristic ε$_{TC}$ of the capacitance and the specific frequency bandwidth Δf/fo. The temperature characteristic of fo$_{TC}$ is set to be within a target value.

Referring to FIG. 1A, a known FM detector circuit of a balanced bridge type includes resistors $R_1$, $R_2$, and $R_3$ respectively connected as three sections, and a discriminator D connected as one remaining section. FIG. 1A is a circuit diagram, and FIG. 1B illustrates a change in the phase of an output voltage Eo. As shown, the FM detector is designed so that the output voltage Eo at the center frequency fo, which lags an input voltage Ei by 90°, is picked up.

An impedance value at the center frequency fo is determined by resistance values of the resistors $R_1$, $R_2$, and $R_3$ included in a detector IC. The resistors $R_1$, $R_2$, and $R_3$ are typically in the vicinity of 1 kΩ.

Some detector ICs have temperature characteristic unique to the internal circuit thereof, and the internal resistors determining the center frequency fo vary in resistance. The variations are attributed to the temperature characteristics of the resistors $R_1$, $R_2$, and $R_3$ defining the bridge circuit. In some detector ICs, a capacitor is connected in parallel with each of the resistors $R_1$, $R_2$, and $R_3$, or a capacitor is substituted for one of the resistors $R_1$, $R_2$, and $R_3$. In this arrangement, the temperature characteristic of the capacitor greatly affects the detector IC.

If the detector IC itself has the temperature characteristic that varies the resistance determining the center frequency fo, the temperature characteristic fo$_{TC}$ of the entire detector circuit including the detector IC is adversely affected even though the temperature characteristic fo$_{TC}$ of the discriminator is stabilized.

SUMMARY OF THE INVENTION

In order to overcome the problems described above, preferred embodiments of the present invention provide an FM detector circuit which has a stable overall temperature characteristic fo$_{TC}$ even if a detector IC has a largely varying temperature characteristic.

According to a preferred embodiment of the present invention, an FM detector circuit includes a discriminator, as a phase shifter, the discriminator including a piezoelectric material, wherein the following equation is satisfied:

$$|(Fr_{TC}+Fa_{TC})/2+K\times\epsilon_{TC}\times(\Delta f/fo)+Cfo_{TC}|\leq\alpha \qquad (1)$$

where ε$_{TC}$ represents a temperature characteristic of a capacitance of the piezoelectric material of the discriminator, Δf/fo represents a specific frequency bandwidth of the FM detector, Fr$_{TC}$ represents a temperature characteristic of a resonance frequency of the FM detector, Fa$_{TC}$ represents a temperature characteristic of an antiresonance frequency of the piezoelectric material, Cfo$_{TC}$ represents a temperature characteristic of the FM detector circuit excluding the discriminator, and α represents a target value of temperature characteristic of a center frequency of the FM detector circuit, wherein K represents a coefficient determined by the impedance at an intermediate point between Fr and Fa, ε$_{TC}$ equals A×(a range of variation of the capacitance of the piezoelectric material within a range of measurement temperature)/{(a capacitance of the piezoelectric material at a reference temperature)×(the range of measurement temperature)}, Δf/fo equals {(Fa at the reference temperature)–(Fr at the reference temperature)}/(fo at the reference temperature), Fr$_{TC}$ equals A×(a range of variation of Fr within the range of measurement temperature)/{(Fr at the reference temperature)×(the range of measurement temperature)}, Fa$_{TC}$ equals A×(a range of variation of Fa within the measurement temperature)/{(Fa at the reference temperature)×(the range of measurement temperature)}, Cfo$_{TC}$ equals A×(the temperature characteristic of the FM detector circuit excluding the discriminator), and A is a coefficient which equals +1 if the temperature characteristic is positive in trend, or equals –1 if the temperature characteristic is negative in trend.

A method of controlling the temperature characteristic of the discriminator proposed in Japanese Patent Application No. 2001-89064 will now be described.

The temperature characteristic ε$_{TC}$ of a capacitance between terminals of a piezoelectric ceramic has a positive characteristic such that the capacitance increases with increases in temperature. With increases in temperature, the impedance of a piezoelectric resonator decreases because of the temperature characteristic of the capacitance as represented by a dotted line shown in FIG. 2 and the center frequency fo is shifted toward the high frequency side (to fo'). Here, the center frequency where the impedance value is about 1 kΩ is preferably fo. Since temperature characteristic $Fr_{TC}$ of the resonance frequency and temperature characteristic $Fa_{TC}$ of the antiresonance frequency have negative trends such that the frequencies Fr and Fa decrease with increases in temperature. The center frequency fo is shifted to the low frequency side (to fo") with increases in temperature as represented by a two-dot-and-dash chain line in FIG. 2. If these shifts are canceled, variations in the center frequency fo due to the temperature change are reduced. The temperature characteristic $fo_{TC}$ of the discriminator as the piezoelectric resonator is thus greatly improved.

The inventors of the present invention have measured the temperature characteristic $\epsilon_{TC}$ of the capacitance, the specific frequency bandwidth Δf/fo, the temperature characteristic $Fr_{TC}$ of the resonance frequency, the temperature characteristic $Fa_{TC}$ of the antiresonance frequency, and the temperature characteristic of $fo_{TC}$ of the center frequency on a variety of piezoelectric materials. The inventors of this invention then discovered that a difference between the temperature characteristic $fo_{TC}$ of the center frequency of the discriminator and a mean value of the temperature characteristic $Fr_{TC}$ of the resonance frequency and the temperature characteristic $Fa_{TC}$ of the antiresonance frequency is proportional to a product of temperature characteristic $\epsilon_{TC}$ of the capacitance and the specific frequency bandwidth Δf/fo. The temperature characteristic $fo_{TC}$ of the center frequency is thus approximated from the temperature characteristic $Fr_{TC}$ of the resonance frequency, the temperature characteristic $Fa_{TC}$ of the antiresonance, the temperature characteristic $\epsilon_{TC}$ of the capacitance and the specific frequency bandwidth Δf/fo.

Now, let β represent the target value of the temperature characteristic of the center frequency of the discriminator. If the temperature characteristic $\epsilon_{TC}$ of the capacitance, the specific frequency bandwidth Δf/fo, the temperature characteristic $Fr_{TC}$ of the resonance frequency, the temperature characteristic $Fa_{TC}$ of the antiresonance frequency are determined in accordance with the following equation, the temperature characteristic $fo_{TC}$ of the discriminator is preferably within the target value β.

$$|(Fr_{TC}+Fa_{TC})/2+K\times\epsilon_{TC}\times(\Delta f/fo)| \leq \beta \qquad (2)$$

where K is a coefficient.

Table 1 lists temperature characteristics and specific frequency bandwidths of the discriminator operating in a shear vibration mode using PZT piezoelectric materials of five different types A through E. Here, the center frequency of the discriminator where the impedance thereof is about 1 kΩ is preferably fo (fo=10.7 MHz).

TABLE 1

| Character-istics | Piezo-electric Materials | | | | |
|---|---|---|---|---|---|
| | A | B | C | D | E |
| $fo_{TC}$ (ppm/°C.) | −27 | −5.3 | 11 | 16 | 20 |
| $Fr_{TC}$ (ppm/°C.) | −116 | −93.1 | −38 | −56 | −54 |
| $Fa_{TC}$ (ppm/°C.) | −79 | −23.4 | −5 | −11 | −6 |
| $\epsilon_{TC}$ (ppm/°C.) | 3660 | 2431 | 2040 | 2380 | 2210 |
| Δf/fo | 0.087 | 0.097 | 0.064 | 0.093 | 0.101 |

In Table 1, the discriminator A uses a conventional piezoelectric material, and the discriminators B through E use newly produced discriminators for test purposes.

Table 2 lists the product of temperature characteristic $\epsilon_{TC}$ of the capacitance and the specific frequency bandwidth Δf/fo and the difference between the temperature characteristic $fo_{TC}$ of the center frequency of the discriminator and the mean value of the temperature characteristic $Fr_{TC}$ of the resonance frequency and the temperature characteristic $Fa_{TC}$ of the antiresonance frequency.

TABLE 2

| | A | B | C | D | E |
|---|---|---|---|---|---|
| $\epsilon_{TC}\Delta f/fo$ | 318.42 | 235.807 | 130.56 | 221.34 | 223.21 |
| $fo_{TC} - (Fr_{TC} + Fa_{TC})/2$ | 70.5 | 52.95 | 32.5 | 49.5 | 50 |

FIG. 3 plots the products and the differences listed in Table 2 of the discriminators A through E. The abscissa represents the product of the temperature characteristic $\epsilon_{TC}$ Of the capacitance and the specific frequency bandwidth Δf/fo and the ordinate represents the difference between the temperature characteristic $fo_{TC}$ of the center frequency of the discriminator and the mean value of the temperature characteristic $Fr_{TC}$ of the resonance frequency and the temperature characteristic $Fa_{TC}$ of the antiresonance frequency.

As seen from FIG. 3, the values of all discriminators are located along a line defined by y=0.225x. The temperature characteristic $fo_{TC}$ of the center frequency of the discriminator is approximated by equation (3).

$$fo_{TC}=(Fr_{TC}+Fa_{TC})/2+0.225\ \epsilon_{TC}\times(\Delta f/fo) \qquad (3)$$

Since the discriminator having the center frequency fo with the impedance value of about 1 kΩ is preferably used, the coefficient K becomes approximately 0.225. In a discriminator having fo with the impedance value that is different from approximately 1 kΩ, the coefficient value K becomes different.

In an FM detector circuit having a bridge shown in FIG. 1, the impedance value resulting in fo is determined by the resistances of resistors $R_1$, $R_2$, and $R_3$ inside the detector IC.

Table 3 lists $fo_{TC}$ determined using equation (3) and measured $fo_{TC}$ for comparison.

As seen from Table 3, the calculated values that closely agree with the measured values suggest that equation (3) provides good approximation. Compared with the discriminator A using the conventional piezoelectric material, the discriminators B–E using the newly produced piezoelectric materials offer excellent temperature characteristic. The discriminators B–D in particular have preferable results.

TABLE 3

| | A | B | C | D | E |
|---|---|---|---|---|---|
| $fo_{TC}$ (calculated values) | −26 | −5 | 8 | 16 | 20 |
| $fo_{TC}$ (measured values) | −27 | −5 | 11 | 16 | 20 |

The above-referenced method determines and then controls the temperature characteristic $fo_{TC}$ of the discriminator only. The detector IC, to which the discriminator is connected, may have temperature characteristics that are unique to an internal circuit thereof. The resistance determining fo may thus be deviated. If the detector IC itself has a temperature characteristic changing the resistance that determines fo, the temperature characteristic $fo_{TC}$ of the entire detector circuit including the detector IC is degraded even if the frequency for the impedance Z=1 kΩ is stabilized in the discriminator.

The present invention provides a method which results in stable temperature characteristic $fo_{TC}$ for the entire detector circuit even if the detector IC has an excess trend in temperature characteristic.

Temperature characteristic $Tfo_{TC}$ is approximated by equation (4).

$$Tfo_{TC}=(Fr_{TC}+Fa_{TC})/2+0.225\times\epsilon_{TC}\times(\Delta f/fo)+Cfo_{TC} \qquad (4)$$

where $Tfo_{TC}$ represents the temperature characteristic of the entire detector circuit including the detector IC, and $Cfo_{TC}$ represents the temperature characteristic of the detector circuit excluding the discriminator.

If the target value of the temperature characteristic of the center frequency of the entire detector circuit is α, the temperature characteristics of the detector IC and the discriminator are selected to satisfy equation (1).

$$|(Fr_{TC}+Fa_{TC})/2+K\times\epsilon_{TC}\times(\Delta f/fo)+Cfo_{TC}|\leq\alpha \qquad (1)$$

If an individual discriminator having a negative $fo_{TC}$ is connected to a detector IC in which a resistance determining fo has a positive trend with increasing temperature, the temperature characteristics of both the detector IC and the discriminator cancel each other. The $fo_{TC}$ of the entire detector circuit including the IC is thus stabilized.

If the discriminator is a piezoelectric resonator encapsulated in a resin mold, the temperature characteristic of the entire detector circuit is subject to the temperature characteristic of the resin mold in addition to the temperature characteristic of the discriminator, and the temperature characteristic $Cfo_{TC}$ of the detector circuit excluding the discriminator.

In another preferred embodiment of the present invention, in addition to the temperature characteristics discussed in connection with the first preferred embodiment of the present invention, the temperature characteristic $Rfo_{TC}$ of the center frequency responsive to stress in the resin mold is taken into consideration so that the temperature characteristic $fo_{TC}$ of the center frequency of the detector circuit fall within the target value α. Specifically, the following equation is satisfied.

$$|(Fr_{TC}+Fa_{TC})/2+K\times\epsilon_{TC}\times(\Delta f/fo)+Rfo_{TC}+Cfo_{TC}|\leq\alpha$$

Preferably, the FM detector circuit includes a bridge circuit having four sections with a discriminator connected as one of the four sections, and an FM intermediate frequency is applied across one pair of diagonally opposed nodes of the bridge circuit and an output is picked up across the pair of diagonally opposed nodes of the bridge circuit.

The bridge detector circuit suffers from less demodulation distortion, and provides an excellent demodulation output. The three sections other than the discriminator may be defined by respective resistors. Alternatively, a capacitor may be connected in parallel with one of the resistors, or may be substituted for one of the resistors.

The target temperature characteristic α of the center frequency of the detector circuit is preferably about 18 ppm/° C.

Specifically, if $fo_{TC}$ is limited to within about ±18 ppm/° C., fo=10.7 MHz suffers from variations within a range of approximately 129 kHz within a temperature range of about 150° C. If these conditions are satisfied, the detector remains operable within a temperature range of about −40° C. to about 105° C. Specifically, the upper limit of the conventional operating temperature is about 60° C., while the upper limit of the detector of preferred embodiments of the present invention is about 100° C. or higher.

Preferably, the coefficient K determined by the impedance at an intermediate point between Fr and Fa equals approximately 0.225.

When the coefficient K is preferably about 0.225 in a piezoelectric resonator having fo with the impedance value of about 1 kΩ, the difference between the temperature characteristic $fo_{TC}$ of the center frequency of the discriminator and the mean value of the temperature characteristic $Fr_{TC}$ of the resonance frequency and the temperature characteristic $Fa_{TC}$ of the antiresonance frequency is substantially proportional to the product of the temperature characteristic $\epsilon_{TC}$ of the capacitance and the specific frequency bandwidth $\Delta f/fo$. The temperature characteristic $fo_{TC}$ of the center frequency is thus accurately determined.

Other features, elements, characteristics and advantages of the present invention will become more apparent from the following detailed description of preferred embodiments thereof with reference to the attached drawings.

BRIEF DESCRIPTION OF THE DRAWINGS

FIGS. 1A and 1B are respectively a circuit diagram and a phase characteristic diagram of a phase shifter including a bridge circuit;

FIGS. 6A and 6B respectively plot the temperature characteristic of a discriminator only having a negative feature and the temperature characteristic of a detector circuit to which the discriminator is connected; and FIGS. 7A and 7B are respectively frontal and lateral sectional views of another discriminator of a preferred embodiment of the present invention.

DETAILED DESCRIPTION OF PREFERRED EMBODIMENTS

Figure 2:
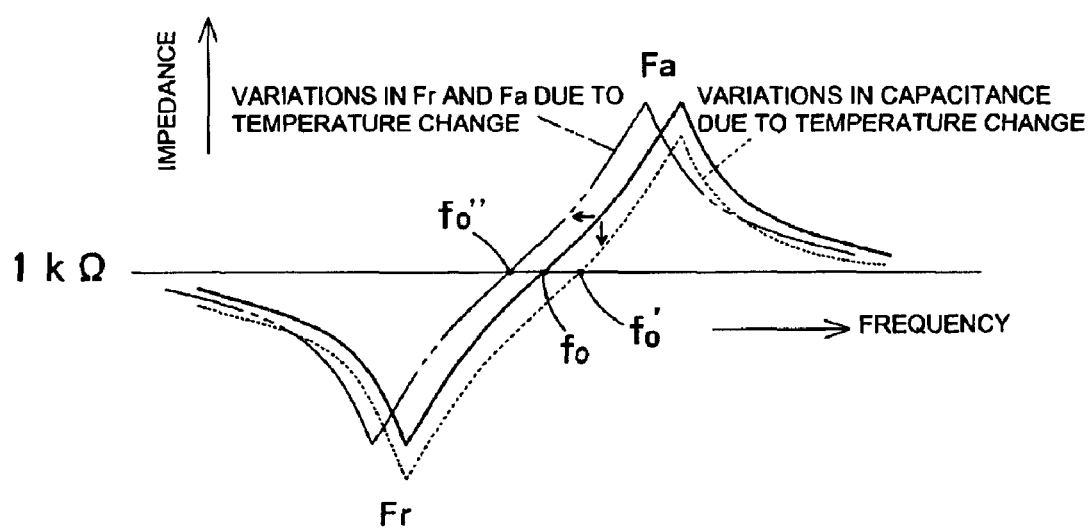
FIG. 2 plots impedances with respect to temperature characteristics of capacitances and Fr and Fa.
Figure 3:
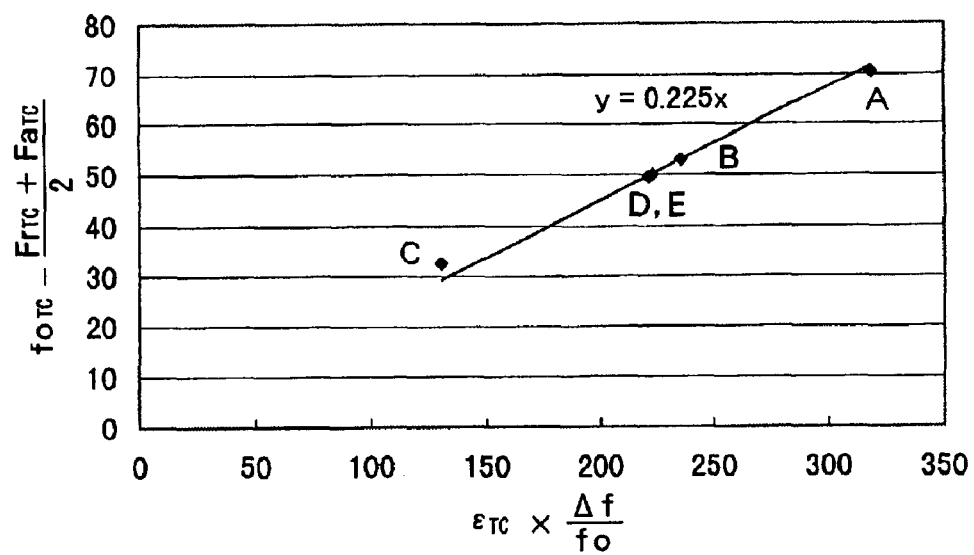
FIG. 3 is a characteristic chart which is intended to determine the temperature characteristic of the discriminator.
Figure 4:
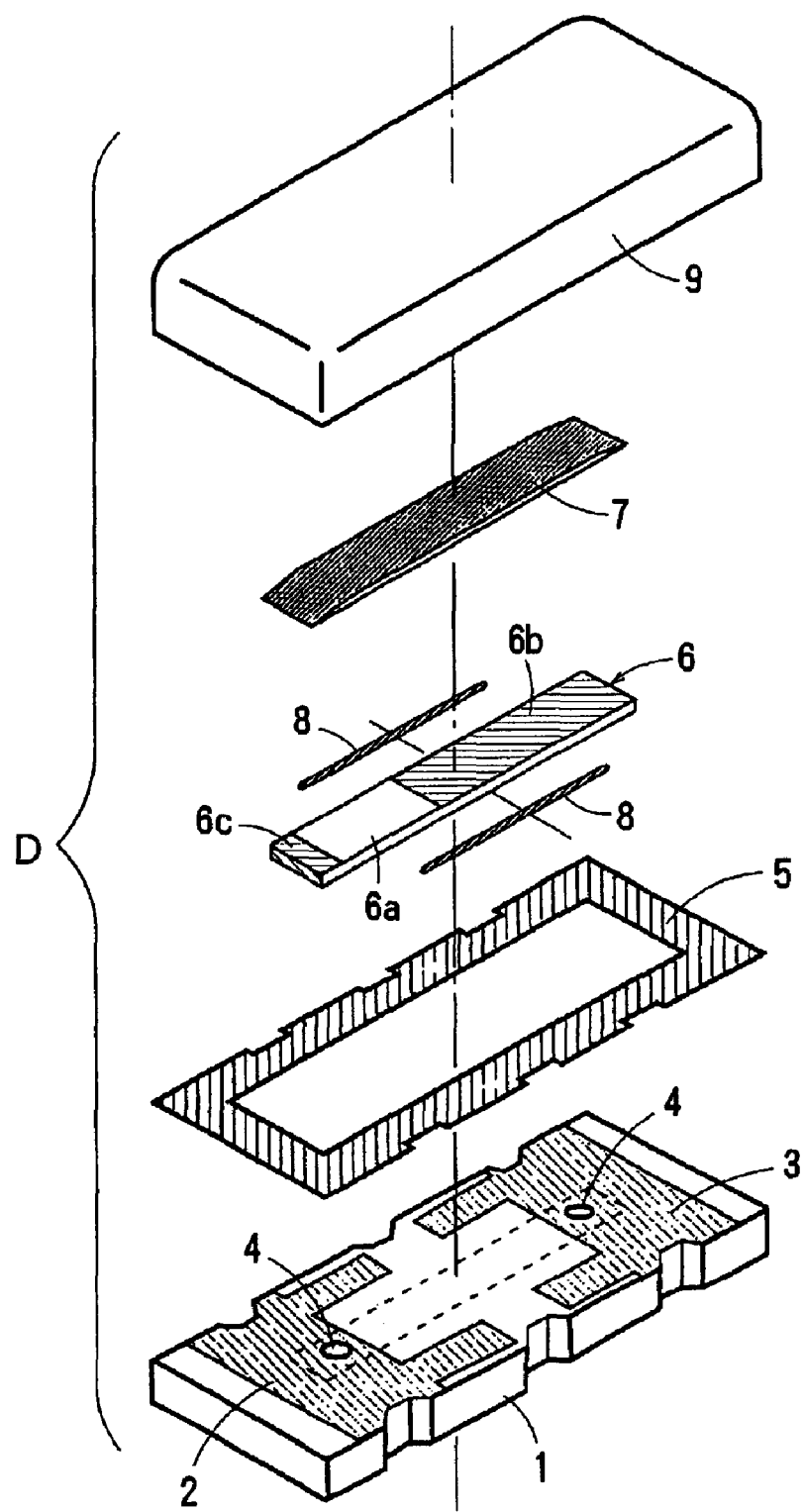
FIG. 4 is an exploded perspective view of the discriminator of preferred embodiments of the present invention.

FIG. 4 shows a monolithic-type piezoelectric resonator as one discriminator D in accordance with a preferred embodiment of the present invention.

The discriminator D includes an insulator substrate 1, an insulator layer 5 including a glass paste arranged on an outline of the insulator substrate 1, a piezoelectric element 6 fixed to and connected to electrodes 2 and 3 disposed on the insulator substrate 1, damping materials 7 and 8 fabricated of silicone rubber applied on the top surface and sidewalls of the piezoelectric element 6, and a metal cap 9 which is bonded on top of the insulator layer 5 of the insulator substrate 1 using an adhesive (not shown) to seal the piezoelectric element 6. The piezoelectric element 6 is an energy trapping shear vibration mode element, and includes a substantially rectangular piezoelectric substrate 6a. Electrodes 6b and 6c are disposed on the top and bottom surfaces of the piezoelectric substrate 6a and face each other at the approximate centers of the piezoelectric substrate 6a with the piezoelectric substrate 6a interposed therebetween. The electrodes 6b and 6c extend beyond different ends of the piezoelectric substrate 6a into the opposite major surfaces of the piezoelectric substrate 6a. The piezoelectric substrate 6a is preferably made of a PZT, and the insulator substrate 1 is preferably made of a ceramic having a thermal expansion coefficient almost equal to that of the piezoelectric substrate 6a.

Since the piezoelectric element 6 in the discriminator is not thermally affected by peripheral components, the temperature characteristic of the discriminator is determined by the temperature characteristic of the piezoelectric element 6 itself.

Figure 5A:
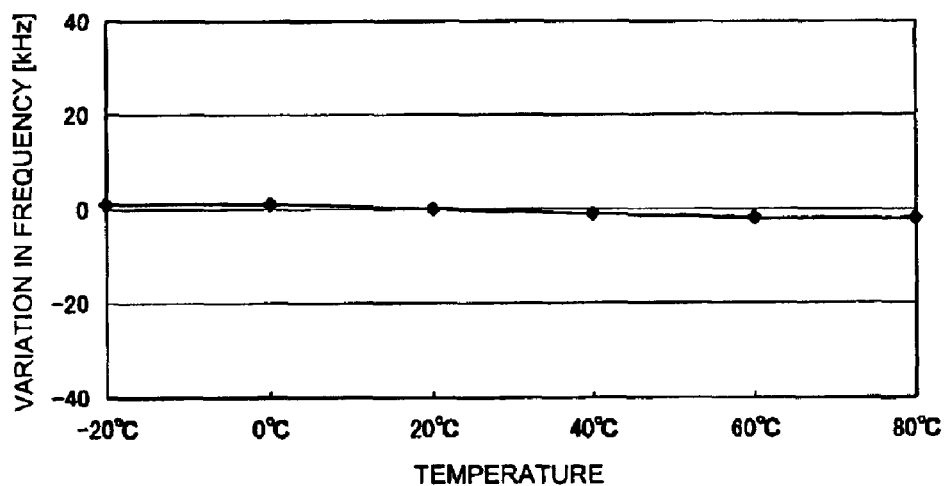
FIGS. 5A and 5B respectively plot the temperature characteristic of a discriminator only having a flat feature and the temperature characteristic of a detector circuit to which the discriminator is connected.

FIGS. 5A and 6A plot the temperature characteristic of the discriminator D having the structure described above, and FIGS. 5B and 6B plot the temperature characteristic of the entire detector circuit in which the discriminator D is connected to the detector IC (see FIG. 1A) with the resistance determining fo is in a positive trend with respect to increases in temperature.

Figure 5B:
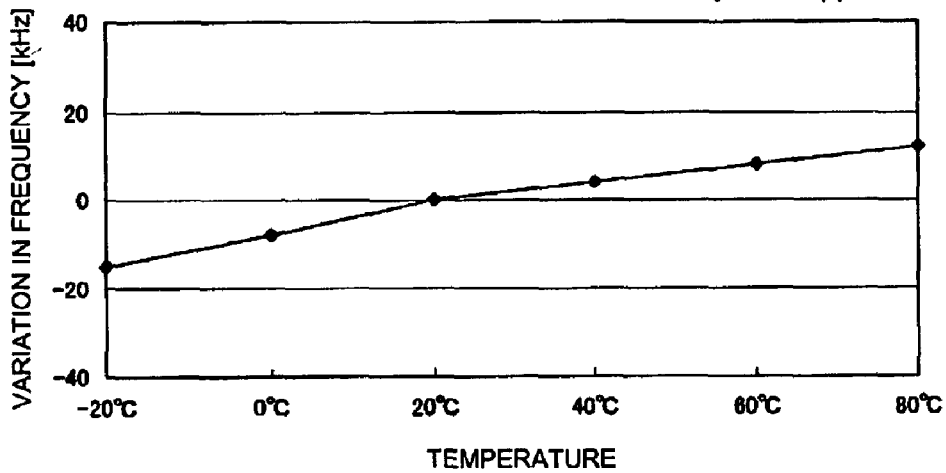

Referring to FIGS. 5A and 5B, the discriminator has a flat $fo_{TC}$ ($fo_{TC}$=−2.8 ppm/° C.), and referring to FIGS. 6A and 6B, the discriminator has a negative $fo_{TC}$ ($fo_{TC}$=−33.8 ppm/° C.).

The detector IC has a temperature characteristic of $Cfo_{TC}$=+28.2 ppm/° C. (estimated value) in response to a variation in the internal resistance thereof. The value of $Cfo_{TC}$ is estimated by connecting a discriminator only having a flat $fo_{TC}$ to the detector IC, and measuring $fo_{TC}$ of the entire detector circuit.

Table 4 lists $Fr_{TC}$, $Fa_{TC}$, $\epsilon_{TC}$, Δf/fo, and $fo_{TC}$ of the discriminators (with fo=10.7 MHz) shown in FIGS. 5A and 5B, and FIGS. 6A and 6B and the temperature characteristic $Tfo_{TC}$ of the entire detector circuit.

$Fr_{TC}$, $Fa_{TC}$, $\Delta_{TC}$, Δf/fo, and $fo_{TC}$ are determined using the following equations based on a temperature range of about −20° C. to about +80° C. with a reference temperature of approximately +20° C.

$Fr_{TC}$=A×(a range of variation of Fr within the range of measurement temperature)/{(Fr at the reference temperature)×(the range of measurement temperature)}

$Fa_{TC}$=A×(a range of variation of Fa within the measurement temperature)/{(Fa at the reference temperature)×(the range of measurement temperature)}

$\epsilon_{TC}$=A×(a range of variation of the capacitance of the piezoelectric material within the range of measurement temperature)/{(the capacitance of the piezoelectric material at the reference temperature)×(the range of measurement temperature)}

Δf/fo={(Fa at the reference temperature)−(Fr at the reference temperature)}/(fo at the reference temperature)

A is a coefficient which equals +1 if the temperature characteristic is positive in trend, or equals −1 if the temperature characteristic is negative in trend.

TABLE 4

|  | Discriminator shown in FIGS. 5A and 5B | Discriminator shown in FIGS. 6A and 6B |
| --- | --- | --- |
| $Fr_{TC}$ | −90 ppm/° C. | −135 ppm/° C. |
| $Fa_{TC}$ | −25 ppm/° C. | −75 ppm/° C. |
| $\epsilon_{TC}$ | +2430 ppm/° C. | 3400 ppm/° C. |
| Δf/fo | 10% | 9.2% |
| $fo_{TC}$ (calculated values) | −2.83 ppm/° C. | −34.6 ppm/° C. |
| $fo_{TC}$ (measured values) | −2.8 ppm/° C. | −33.8 ppm/° C. |
| $Cfo_{TC}$ | +28.2 ppm/° C. | +28.2 ppm/° C. |
| $Tfo_{TC}$ (calculated values) | +25.38 ppm/° C. | −6.42 ppm/° C. |
| $Tfo_{TC}$ (measured values) | +25.4 ppm/° C. | −6.5 ppm/° C. |

The temperature characteristic $fo_{TC}$ of the discriminator only is calculated by replacing $Fr_{TC}$, $Fa_{TC}$, $\epsilon_{TC}$, Δf/fo, and $fo_{TC}$ by the above values in equation (3).

In the discriminator shown in FIG. 5A, $$fo_{TC}=(-90-25)/2+0.225\times2430\times0.1=-2.83 \text{ ppm/° C.}$$

In the discriminator shown in FIG. 6A, $$fo_{TC}=(-135-75)/2+0.225\times3400\times0.092=-34.6 \text{ ppm/° C.}$$

The calculated values agree with the respective measured values (−2.8 ppm/° C. and −33.8 ppm/° C.). Equation (3) proves accurate.

If the temperature characteristic $Tfo_{TC}$ of the entire detector circuit is calculated by replacing K with about 0.225 in equation (4), the temperature characteristic $Tfo_{TC}$ in the discriminator shown in FIGS. 5A and 5B becomes $$Tfo_{TC} = (Fr_{TC} + Fa_{TC})/2 + K \times \epsilon_{TC} \times (\Delta f / fo) + Cfo_{TC}$$

$$= (-90 - 25)/2 + 0.255 \times 2430 \times 0.1 + 28.2$$

$$= +25.38 \text{ ppm/° C.}$$

The temperature characteristic $Tfo_{TC}$ in the discriminator shown in FIGS. 6A and 6B becomes $$Tfo_{TC} = (Fr_{TC} + Fa_{TC})/2 + K \times \epsilon_{TC} \times (\Delta f / fo) + Cfo_{TC}$$

$$= (-135 - 75)/2 + 0.225 \times 3400 \times 0.092 + 28.2$$

$$= -6.42 \text{ ppm/° C.}$$

These calculated values also agree well with the measured values (+25.4 ppm/° C. and −6.5 ppm/° C.). Equation (4) proves accurate.

As seen from Table 4, the temperature characteristic $Tfo_{TC}$ of the entire detector circuit is as poor as about +25.4 ppm/° C. if the discriminator having a flat feature ($fo_{TC}$=−2.8 ppm/° C.) shown in FIGS. 5A and 5B is used.

In contrast, the temperature characteristic $Tfo_{TC}$ of the entire detector circuit is as good as approximately −6.5 ppm/° C. if the discriminator having a negative feature ($fo_{TC}$=−33.8 ppm/° C.) shown in FIGS. 6A and 6B is used.

It is preferred that the absolute value of a temperature characteristic of the FM detector determined by equation (1) be about 18 ppm/° C. or less. The discriminator shown in FIGS. 6A and 6B satisfies this requirement.

An excellent temperature characteristic of the entire detector circuit is obtained by taking into consideration the temperature characteristic $Cfo_{TC}$ of the detector IC only, and by selecting a discriminator that have a reverse feature.

FIGS. 7A and 7B show another example of piezoelectric resonator usable in the discriminator of preferred embodiments of the present invention.

This discriminator is a piezoelectric resonator having a lead and encapsulated in a resin mold. The piezoelectric resonator includes a substantially rectangular piezoelectric element 10 operating in a shear vibration mode at fo=10.7 MHz. Vibrating electrodes 10a and 10b are respectively disposed at the approximate centers of the top and bottom surfaces of the piezoelectric element 10, and terminal electrodes 10c and 10d are disposed on ends of the piezoelectric element 10. Lead ends 11 and 12 are respectively soldered to the terminal electrodes 10c and 10d. The lead end 11 is folded from the bottom surface over the top surface of the piezoelectric element 10. An elastic member 14 preferably made of a silicone rubber covers the vibrating electrodes 10a and 10b of the piezoelectric element 10. The entire piezoelectric element 10 is encapsulated in a resin mold 15 preferably made of an epoxy resin. The resin mold 15 is then covered with a transparent epoxy resin 16.

In the discriminator with the piezoelectric element 10 encapsulated in resin molds 14, 15, and 16, the temperature characteristic $Tfo_{TC}$ of the detector circuit is subject to the effect of the $Rfo_{TC}$ due to stress responsive to tightening of the resin molds 14, 15, and 16 in addition to the temperature characteristic $fo_{TC}$ of the discriminator only, and the temperature characteristic $Cfo_{TC}$ of the detector IC excluding the discriminator.

Specifically, the temperature characteristic $Tfo_{TC}$ of the detector circuit is expressed as follows:

$$Tfo_{TC}=(Fr_{TC}+Fa_{TC})/2+0.225\times \epsilon_{TC}\times(\Delta f/fo)+Rfo_{TC}+Cfo_{TC} \quad (5)$$

A measured $Rfo_{TC}$ arising from stress responsive to tightening of the outer resins 14, 15, and 16 in the resin-molded discriminator shown in FIGS. 7A and 7B is about +15 ppm/° C.

The temperature characteristic $Tfo_{TC}$ of the detector circuit is determined by replacing $Rfo_{TC}$ in equation (5) with +15. Here, the values of $Fr_{TC}$, $Fa_{TC}$, $\epsilon_{TC}$, $\Delta f/fo$, and Cfo remain unchanged from those shown in FIGS. 5A and 5B and FIGS. 6A and 6B.

In the discriminator shown in FIGS. 5A and 5B, $$Tfo_{TC} = (-90-25)/2 + 0.225 \times 2430 \times 0.1 + 15 + 28.2$$
$$= +40.37 \text{ ppm/}°C.$$

In the discriminator shown in FIGS. 6A and 6B, $$Tfo_{TC} = (-135-75)/2 + 0.225 \times 3400 \times 0.092 + 15 + 28.2$$
$$= +8.58 \text{ ppm/}°C.$$

If the target value α of the temperature coefficient of the center frequency is about 18 ppm/° C., the temperature characteristic $Tfo_{TC}$=+8.58 ppm/° C. of the detector circuit using the discriminator shown in FIGS. 6A and 6B is substantially smaller than the target value α. The resulting temperature characteristic is thus excellent.

In the above-described preferred embodiments, the detector circuit is a bridge circuit type. The present invention is not limited to this type. The present invention is preferably applied to a detector circuit of any known type including a discriminator. The bridge circuit type is not limited to the one having resistors $R_1$–$R_3$ at three sections thereof. Capacitors may be respectively connected in parallel with the resistors $R_1$–$R_3$, or a capacitor may be substituted for one of the resistors $R_1$–$R_3$.

The discriminator has a cap-covered structure shown in FIG. 4 or a resin-molded structure shown in FIG. 7. Alternatively, the discriminator may have a conventional bonded laminate structure. In this case, $fo_{TC}$ is calculated using equation (3) because no resin mold is used.

The vibration mode of the discriminator of preferred embodiments of the present invention is not limited to a thickness shear vibration mode. The vibration mode may be a thickness longitudinal vibration mode or other suitable vibration mode.

The entire detector circuit has an excellent temperature characteristic by connecting, to the detector IC, the discriminator having a temperature characteristic reverse to that of the detector IC taking into consideration the temperature characteristic $Cfo_{TC}$ of the detector IC only.

The combination of the detector IC and the discriminator is determined taking into consideration the temperature characteristic $\epsilon_{TC}$ of the capacitance of the discriminator, the specific frequency bandwidth Δf/fo, the temperature characteristic $Fr_{TC}$ of the resonance frequency, and the temperature characteristic $Fa_{TC}$ of the antiresonance frequency. The temperature characteristic of the detector circuit is precisely controlled.

With the detector circuit, the range of operating temperature is widened. An apparatus including the detector circuit thus has a wider operating temperature range.

Since the effect of the temperature characteristic of the resin mold is eliminated or reduced, the temperature characteristic of the detector circuit is stabilized even if the resin-molded discriminator is used.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An FM detector circuit comprising:
   a discriminator defining a phase shifter and including a piezoelectric material, wherein the following equation is satisfied:

$$|(Fr_{TC}+Fa_{TC})/2+K\times\epsilon_{TC}\times(\Delta f/fo)+Cfo_{TC}|\leq \alpha$$

where $\epsilon_{TC}$ represents a temperature characteristic of a capacitance of the piezoelectric material of the discriminator, Δf/fo represents a specific frequency bandwidth of the FM detector, $Fr_{TC}$ represents a temperature characteristic of a resonance frequency of the FM detector, $Fa_{TC}$ represents a temperature characteristic of an antiresonance frequency of the FM detector, $Cfo_{TC}$ represents a temperature characteristic of the FM detector circuit excluding the discriminator, and α represents a target value of temperature characteristic of the center frequency of the FM detector circuit, wherein K represents a coefficient determined by an impedance at an intermediate point between Fr and Fa, $\epsilon_{TC}$ equals A×(a range of variation of capacitance of the piezoelectric material within a range of measurement temperature)/{(the capacitance of the piezoelectric material at a reference temperature)×(the range of measurement temperature)}, Δf/fo equals {(Fa at the reference temperature)−(Fr at the reference temperature)}/(fo at the reference temperature), $Fr_{TC}$ equals A×(a range of variation of Fr within the range of measurement temperature)/{(Fr at the reference temperature)×(the range of measurement temperature)}, $Fa_{TC}$ equals A×(a range of variation of Fa within the measurement temperature)/{(Fa at the reference temperature)×(the range of measurement temperature)}, $Cfo_{TC}$ equals A×(the temperature characteristic of the FM detector circuit excluding the discriminator), and A is a coefficient which equals +1 if the temperature characteristic is positive in trend, or equals −1 if the temperature characteristic is negative in trend.

2. An FM detector circuit according to claim 1, wherein the FM detector circuit includes a bridge circuit having four sections with the discriminator connected as one of the four sections, and wherein an FM intermediate frequency is applied across one pair of diagonally opposed nodes of the bridge circuit and an output is picked up across the other pair of diagonally opposed nodes.

3. An FM detector circuit according to claim 1, wherein α equals approximately 18 ppm/° C.

4. An FM detector circuit according to claim 1, wherein K equals about 0.225.

5. An FM detector circuit according to claim 1, wherein the discriminator comprises a monolithic-type piezoelectric resonator.

6. An FM detector circuit according to claim 1, wherein the discriminator includes an insulator substrate having electrodes disposed thereon, an insulator layer including a glass paste arranged on an outline of the insulator substrate, a piezoelectric element fixed to and connected to the electrodes disposed on the insulator substrate, damping materials on the top surface and sidewalls of the piezoelectric element, and a metal cap which is bonded on top of the insulator layer of the insulator substrate.

7. An FM detector circuit according to claim 6, wherein the piezoelectric element is an energy trapping shear vibration mode element.

8. An FM detector circuit according to claim 6, wherein the piezoelectric element includes a substantially rectangular piezoelectric substrate and the electrodes are disposed on top and bottom surfaces of the piezoelectric substrate so as to face each other at approximate centers of the piezoelectric substrate.

9. An FM detector circuit according to claim 8, wherein the piezoelectric substrate is made of a PZT and the insulator substrate is made of a ceramic having a thermal expansion coefficient that is almost equal to that of the piezoelectric substrate.

10. An FM detector circuit according to claim 1, wherein the discriminator operates in one of a thickness shear vibration mode and a thickness longitudinal vibration mode.

11. An FM detector circuit comprising:

a discriminator defining a phase shifter;

a resin mold encapsulating the discriminator; wherein the following equation is satisfied:

$$|(Fr_{TC}+Fa_{TC})/2+K\times\epsilon_{TC}\times(\Delta f/fo)+Rfo_{TC}+Cfo_{TC}| \leq \alpha$$

where $\epsilon_{TC}$ represents a temperature characteristic of a capacitance of a piezoelectric material of the discriminator, $\Delta f/fo$ represents a specific frequency bandwidth of the FM detector, $Fr_{TC}$ represents a temperature characteristic of a resonance frequency of the FM detector, $Fa_{TC}$ represents a temperature characteristic of an antiresonance frequency of the FM detector, $Rfo_{TC}$ represents a temperature characteristic of a center frequency responsive to stress in the resin mold, $Cfo_{TC}$ represents a temperature characteristic of the FM detector circuit excluding the discriminator, and $\alpha$ represents a target value of temperature characteristic of a center frequency of the FM detector circuit, wherein K represents a coefficient determined by the impedance at an intermediate point between Fr and Fa, $\epsilon_{TC}$ equals A×(a range of variation of the capacitance of the piezoelectric material within a range of measurement temperature)/{(a capacitance of the piezoelectric material at a reference temperature)×(the range of measurement temperature)}, $\Delta f/fo$ equals {(Fa at the reference temperature)−(Fr at the reference temperature)}/(fo at the reference temperature), $Fr_{TC}$ equals A×(a range of variation of Fr within the range of measurement temperature)/{(Fr at the reference temperature)×(the range of measurement temperature)}, $Fa_{TC}$ equals A×(a range of variation of Fa within the measurement temperature)/{(Fa at the reference temperature)×(the range of measurement temperature)}, $Cfo_{TC}$ equals A×(the temperature characteristic of the FM detector circuit excluding the discriminator), and A is a coefficient which equals +1 if the temperature characteristic is positive in trend, or equals −1 if the temperature characteristic is negative in trend.

12. An FM detector circuit according to claim 11, wherein the FM detector circuit includes a bridge circuit having four sections with the discriminator connected as one of the four sections, and wherein an FM intermediate frequency is applied across one pair of diagonally opposed nodes of the bridge circuit and an output is picked up across the other pair of diagonally opposed nodes.

13. An FM detector circuit according to claim 11, wherein $\alpha$ equals approximately 18 ppm/° C.

14. An FM detector circuit according to claim 11, wherein K equals about 0.225.

15. An FM detector circuit according to claim 11, wherein the discriminator comprises a monolithic-type piezoelectric resonator.

16. An FM detector circuit according to claim 11, wherein the discriminator includes an insulator substrate having electrodes disposed thereon, an insulator layer including a glass paste arranged on an outline of the insulator substrate, a piezoelectric element fixed to and connected to the electrodes disposed on the insulator substrate, damping materials on the top surface and sidewalls of the piezoelectric element, and a metal cap which is bonded on top of the insulator layer of the insulator substrate.

17. An FM detector circuit according to claim 16, wherein the piezoelectric element is an energy trapping shear vibration mode element.

18. An FM detector circuit according to claim 16, wherein the piezoelectric element includes a substantially rectangular piezoelectric substrate and the electrodes are disposed on top and bottom surfaces of the piezoelectric substrate so as to face each other at approximate centers of the piezoelectric substrate.

19. An FM detector circuit according to claim 18, wherein the piezoelectric substrate is made of a PZT and the insulator substrate is made of a ceramic having a thermal expansion coefficient that is almost equal to that of the piezoelectric substrate.

20. An FM detector circuit according to claim 11, wherein the discriminator operates in one of a thickness shear vibration mode and a thickness longitudinal vibration mode.

* * * * *